(12) United States Patent
Hashimoto (10) Patent No.: US 7,145,600 B2
(45) Date of Patent: Dec. 5, 2006

(54) IMAGE PICKUP APPARATUS HAVING A PLURALITY OF CCDS, CHARGE DETECTING CIRCUITS, AND A/D CONVERSION CIRCUITS

(75) Inventor: Seiji Hashimoto, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 637 days.

(21) Appl. No.: 09/982,886

(22) Filed: Oct. 22, 2001

(65) Prior Publication Data

US 2002/0054227 A1 May 9, 2002

(30) Foreign Application Priority Data

Oct. 24, 2000 (JP) ............................. 2000-324451

(51) Int. Cl.
H04N 3/14 (2006.01)
(52) U.S. Cl. ...................................... 348/294; 348/302
(58) Field of Classification Search ................ 348/322, 348/311, 302, 294, 312
See application file for complete search history.

(56) References Cited

U.S. PATENT DOCUMENTS

| | | | |
|---|---|---|---|
| 4,768,085 A | 8/1988 | Hashimoto ..................... 358/48 |
| 4,876,601 A | 10/1989 | Hashimoto et al. .... 358/213.26 |
| 4,910,597 A | 3/1990 | Harada et al. .......... 358/213.15 |
| 4,910,599 A | 3/1990 | Hashimoto ............. 358/213.26 |
| 4,914,519 A | 4/1990 | Hashimoto et al. .... 358/213.18 |
| 4,967,067 A | 10/1990 | Hashimoto et al. ...... 250/208.1 |
| 4,985,758 A | 1/1991 | Hashimoto ..................... 358/44 |
| 5,162,912 A | 11/1992 | Ueno et al. ............ 358/213.16 |
| 5,262,850 A | 11/1993 | Hashimoto .................. 358/500 |
| 5,288,988 A | 2/1994 | Hashimoto et al. ....... 250/208.1 |
| 5,315,412 A | 5/1994 | Mihara et al. ............... 358/512 |
| 5,449,908 A * | 9/1995 | Wadsworth et al. ......... 250/332 |
| 5,477,070 A * | 12/1995 | Nam ........................... 257/239 |
| 5,587,814 A | 12/1996 | Mihara et al. ............... 358/512 |
| 5,767,904 A * | 6/1998 | Miyake ....................... 348/362 |
| 5,925,883 A * | 7/1999 | Woolaway, II ......... 250/370.08 |
| 5,990,948 A * | 11/1999 | Sugiki ......................... 348/250 |
| 6,504,574 B1 * | 1/2003 | Noguchi et al. ............. 348/295 |
| 6,518,910 B1 * | 2/2003 | Sakuragi et al. ............. 341/162 |
| 6,618,089 B1 * | 9/2003 | Tamayama ............. 348/333.13 |
| 6,965,407 B1 * | 11/2005 | Boemler et al. ............. 348/302 |
| 2004/0017494 A1 * | 1/2004 | Lu et al. ..................... 348/294 |

* cited by examiner

Primary Examiner—Ngoc-Yen Vu
Assistant Examiner—Gary C. Vieaux
(74) Attorney, Agent, or Firm—Fitzpatrick, Cella, Harper & Scinto (57) ABSTRACT

An image pickup apparatus includes a solid-state image pickup element formed on a single semiconductor chip, the solid-state image pickup element including photoelectric conversion units arranged two-dimensionally, a plurality of CCDs for transferring charges generated by the photoelectric conversion units arranged two-dimensionally, each of the plurality of CCDs being arranged correspondingly to each line of photoelectric conversion units, a plurality of charge detection circuits for detecting the charges from the plurality of CCDs and supplying corresponding signal levels, each of the plurality of charge detection circuits being arranged correspondingly to each CCD, a common output line to which signals from the plurality of charge detection circuits are sequentially output, a plurality of transfer transistors for transferring the signals from the plurality of charge detection circuits to the common output line, and a scanning circuit for controlling the plurality of transfer transistors to sequentially output the signals from the plurality of charge detection circuits to the common output line.

8 Claims, 11 Drawing Sheets

FIG. 13

IMAGE PICKUP APPARATUS HAVING A PLURALITY OF CCDS, CHARGE DETECTING CIRCUITS, AND A/D CONVERSION CIRCUITS

BACKGROUND OF THE INVENTION

1. Field of the Invention

The present invention relates to an image pickup apparatus for picking up an object image.

2. Related Background Art

Conventional solid-state image pickup elements are mainly classified into CCD-type elements and CMOS-type elements. Examples of CCD-type elements are an interline CCD (IL-CCD) and frame transfer CCD (FT-CCD).

Figure 11:
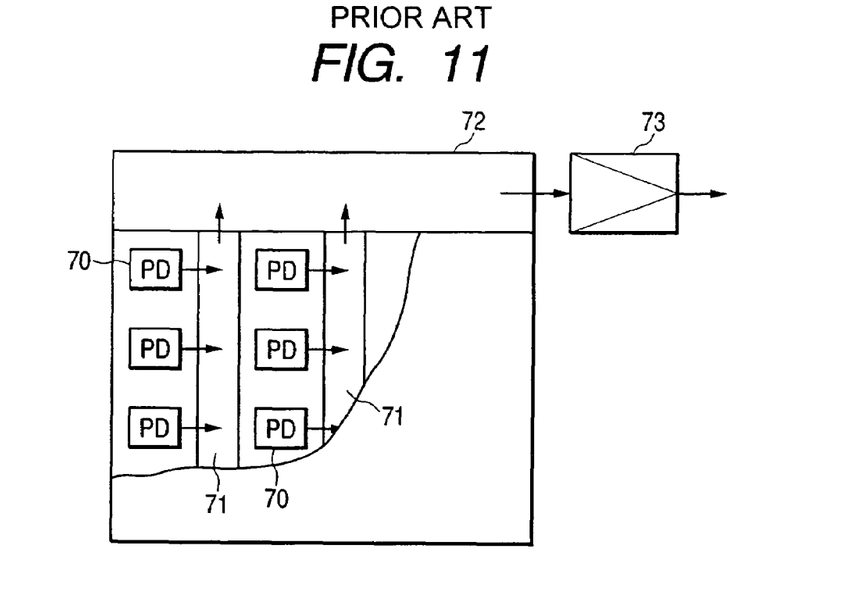
FIG. 11 is a schematic view of an IL-CCD.

An interline CCD comprises a plurality of photoelectric conversion units, vertical CCDs, transfer gates for transferring signal charges in the photoelectric conversion units to the vertical CCDs, a horizontal CCD for horizontally transferring the charges from the vertical CCDs, and a floating diffusion amplifier (FD-Amp). A frame transfer CCD comprises photoelectric conversion units, a storage unit to which charges in the photoelectric conversion units are transferred (frame-shifted), a horizontal transfer unit for horizontally transferring the charges from the storage unit, and a floating diffusion amplifier (FD-Amp). FIG. 11 shows an IL-CCD as a typical example of a CCD-type solid-state image pickup element.

As shown in FIG. 11, an IL-CCD comprises photoelectric conversion units (PDs) 70, vertical CCDs (V-CCDs) 71 for temporarily storing charges from the photoelectric conversion units 70, a horizontal CCD (H-CCD) 72 for receiving the charges from the vertical CCDs 71 and transferring the charges in the horizontal direction, and a floating diffusion amplifier (FD-Amp) 73 serving as an output amplifier for converting the charges from the horizontal CCD 72 into a voltage.

The CCD has low noise level because signal charges are completely transferred to the FD-Amp on the output side. In addition, the pixel size can be made small because of the simple pixel structure. Today, however, the number of pixels in a sensor for a digital camera reaches several millions for higher quality, and high-speed drive is indispensable in an HD camera. For this reason, the power consumption of a horizontal CCD drive circuit is high (up to $CfV_2$). Although a CDS circuit for reducing reset noise in an FD-Amp requires a sampling accuracy on the order of nsec, that sampling accuracy cannot be ensured because of the mass production and the wide range of use conditions (temperature and a variation in voltage). Hence, a low-noise CCD can hardly be implemented.

Figure 12:
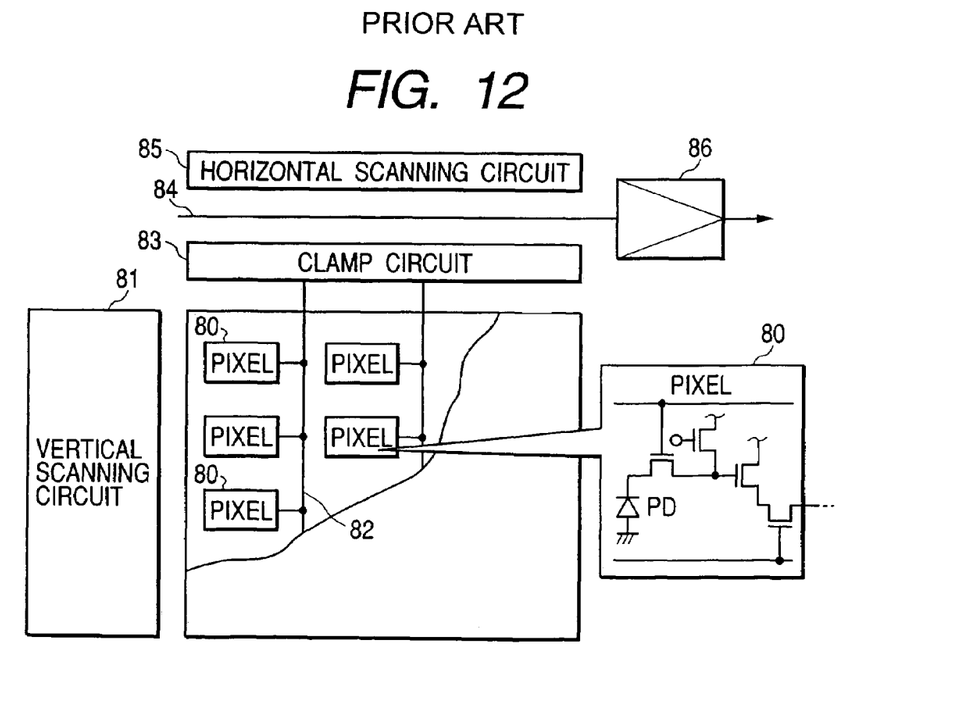
FIG. 12 is a schematic view of a CMOS sensor.

In a CMOS sensor, as shown in FIG. 12, each pixel unit 80 comprises a photoelectric conversion unit PD and a MOS transistor serving as a pixel amplifier. The pixels are selected and driven by a random-accessible vertical scanning circuit 81 and horizontal scanning circuit 85, resulting in functional advantage. Charges in each pixel unit 80 are converted into a voltage by the pixel amplifier, output to a clamp circuit 83 through a vertical signal line 82, and after noise removal from the pixel unit amplifier by the clamp circuit 83, output to a horizontal signal line 84. The signals are sequentially output by the horizontal scanning circuit 85 from the horizontal signal line 84 through an amplifier (Amp) 86. Since a CMOS sensor sequentially selects and outputs each pixel signal by the horizontal scanning circuit 85, unlike charge transfer as in a CCD, the power consumption is low.

However, since the number of elements of each pixel unit is large, it is difficult to reduce the pixel size.

As described above, a CCD is advantageous in increasing the number of pixels but disadvantageous in high-speed drive and power consumption. Conversely, a CMOS sensor is disadvantageous in increasing the number of pixels but advantageous in high-speed drive and power consumption.

SUMMARY OF THE INVENTION

It is an object of the present invention to provide an image pickup apparatus suitable to increase the number of pixels and capable of high-performance function, power consumption reduction, and high-speed drive.

In order to achieve the above object, according to an aspect of the present invention, there is provided an image pickup apparatus comprising:

a solid-state image pickup element formed on a single semiconductor chip, the solid-state image pickup element including:

photoelectric conversion units arranged two-dimensionally;

a plurality of CCDs adapted to transfer charges generated by the photoelectric conversion units arranged two-dimensionally, each of the plurality of CCDs being arranged correspondingly to each line of photoelectric conversion units;

a plurality of charge detection circuits adapted to detect the charges from the plurality of CCDs and supplying corresponding signal levels, each of the plurality of charge detection circuits being arranged correspondingly to each CCD;

a common output line to which signals from the plurality of charge detection circuits are sequentially output;

a plurality of transfer transistors adapted to transfer the signals from the plurality of charge detection circuits to the common output line; and a scanning circuit adapted to control the plurality of transfer transistors to sequentially output the signals from the plurality of charge detection circuits to the common output line.

According to another aspect of the present invention, there is provided an image pickup apparatus comprising:

a solid-state image pickup element formed on a single semiconductor chip, the solid-state image pickup element including:

photoelectric conversion units arranged two-dimensionally;

a plurality of CCDs adapted to transfer charges generated by the photoelectric conversion units, each of the plurality of CCDs being arranged correspondingly to each line of photoelectric conversion units;

a plurality of charge detection circuits adapted to detect the charges from the CCDs and supplying corresponding signal levels, each of the plurality of charge detection circuits being arranged correspondingly to each CCD; and a plurality of A/D conversion circuits adapted to convert the signals from the charge detection circuits into digital signals, each of the A/D conversion circuits being arranged correspondingly to each charge detection circuit.

The above and other objects, features, and advantages of the present invention will become apparent from the following description in conjunction with the accompanying drawings.

DETAILED DESCRIPTION OF THE PREFERRED EMBODIMENTS

The embodiments of the present invention will be described below in detail with reference to the accompanying drawings. An arrangement using an interline CCD (IL-CCD) will be described here. The present invention can also be applied to a frame transfer CCD. In that case, charges from a storage unit are output to a charge detection circuit.

Figure 1:
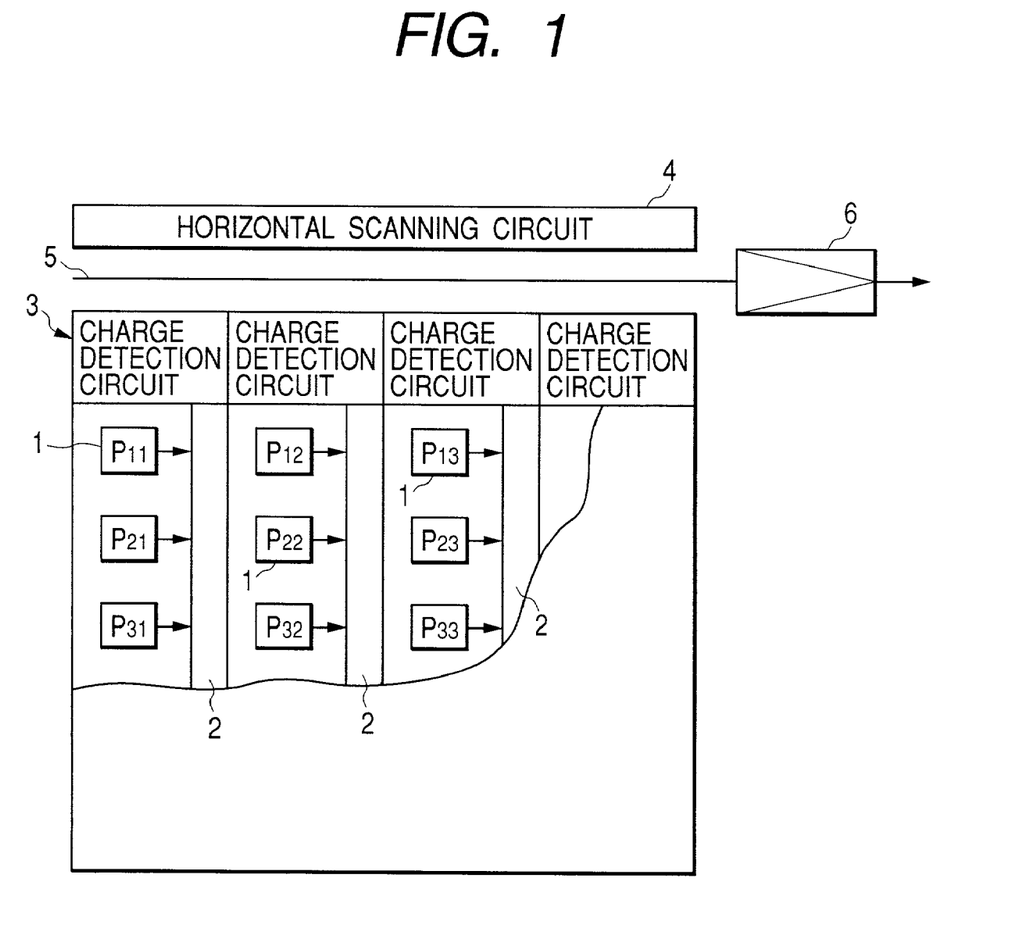
FIG. 1 is a schematic view showing a solid-state image pickup element according to the first embodiment of the present invention.

FIG. 1 is a schematic view showing a solid-state image pickup element according to the first embodiment of the present invention. Object light is photoelectrically converted by photodiodes (PDs) 1 each serving as a photoelectric conversion unit. The photodiodes 1 are arrayed in a matrix form as pixels $P_{11}, P_{12}, P_{13}, \ldots, P_{21}, P_{22}, P_{23}, \ldots, P_{31}, P_{32}, P_{33}, \ldots$. Charges photoelectrically converted by the photodiodes 1 are transferred to vertical CCDs 2 through transfer gates. The charges transferred to the vertical CCDs 2 are transferred to charge detection circuits 3 and converted into a voltage at once every horizontal period. The interline CCD unit is formed from the photodiodes 1 and vertical CCDs 2. Unlike the conventional interline CCD shown in FIG. 11, signal charges from the vertical CCDs are transferred (not to the horizontal CCD) to the charge detection circuits 3.

The signal voltage is output to a horizontal signal line 5 in accordance with a pulse from a horizontal scanning circuit 4 and guided to an image signal processing circuit (not shown) on the output side through an output amplifier 6.

The output signal from each charge detection circuit 3 may be directly read out. Alternatively, a signal processing means for executing signal processing such as noise removal or A/D conversion may be provided on the output side of each charge detection circuit 3 and the signal may be output by the horizontal scanning circuit 4.

The solid-state image pickup element shown in FIG. 1 is formed on a single semiconductor chip.

Figure 2:
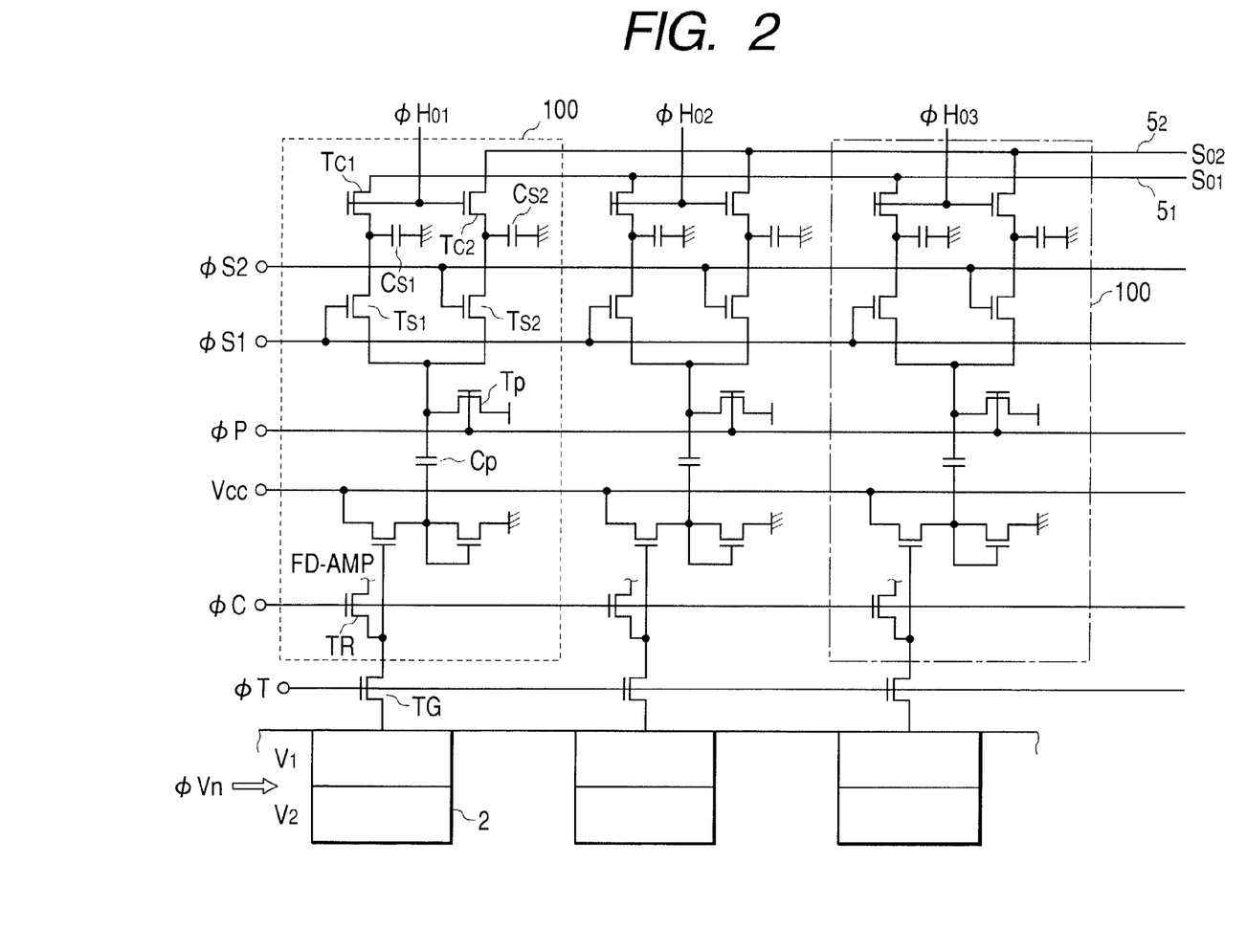
FIG. 2 is a schematic view of a charge detection circuit and signal processing circuit shown in FIG. 1.

FIG. 2 is a schematic view of the charge detection circuit and signal processing circuit shown in FIG. 1. The charge detection circuit comprises a charge detection amplifier (FD-Amp; floating diffusion amplifier) having a gate to which signal charges from the vertical CCD are transferred, and a reset transistor TR for resetting the gate of the charge detection amplifier. The signal processing circuit comprises a clamp capacitor Cp for removing noise, a transistor Tp, storage capacitors $C_{S1}$ and $C_{S2}$ for storing signals after noise removal, transfer transistors $T_{S1}$ and $T_{S2}$ for connecting the clamp capacitor Cp to the storage capacitors $C_{S1}$ and $C_{S2}$, and transistors $T_{C1}$ and $T_{C2}$ for outputting signals from the storage capacitors $C_{S1}$ and $C_{S2}$ to horizontal signal lines $5_1$ and $5_2$. These components form a charge detection/signal processing block 100.

The vertical CCD 2 transfers charges to the charge detection amplifier (FD-Amp; floating diffusion amplifier) through a transfer gate TG every horizontal period in accordance with a drive pulse φVn. In the charge detection amplifier (FD-Amp), reset noise is generated by a parasitic capacitance and the reset transistor TR for removing residual voltage (charges) in the gate unit. In addition, the offset voltage fluctuates among the charge detection amplifiers (FD-Amps). To remove these noise components, the noise is clamped by the clamp capacitor Cp before the charges are transferred from the vertical CCD 2 to the charge detection amplifier (FD-Amp).

After this clamp, the transfer gate TG is turned on to transfer the charges in the vertical CCD 2 (signal charges from the pixels $P_{11}, P_{12}, P_{13}, \ldots$) to the gate unit of the charge detection amplifier (FD-Amp) and converted into a voltage by its parasitic capacitance. The above-described reset noise and offset voltage are superposed on the output signal voltage from the charge detection amplifier. Since the noise components are clamped by the clamp capacitor Cp, the noise is consequently removed at the output terminal of the clamp capacitor Cp, and only the signal voltage is stored in the storage capacitor $C_{S1}$.

With the same operation, the next charges in the vertical CCD 2 (signal charges from the pixels $P_{21}, P_{22}, P_{23}, \ldots$) are converted into a voltage and, after noise removal, stored in the storage capacitor $C_{S2}$. Pixel signals $S_{01}$ and $S_{02}$ of two rows which are stored in the storage capacitors $C_{S1}$ and $C_{S2}$ are sequentially transferred to the horizontal signal lines $5_1$ and $5_2$ in accordance with a scanning pulse from the horizontal scanning circuit 4.

Figure 3:
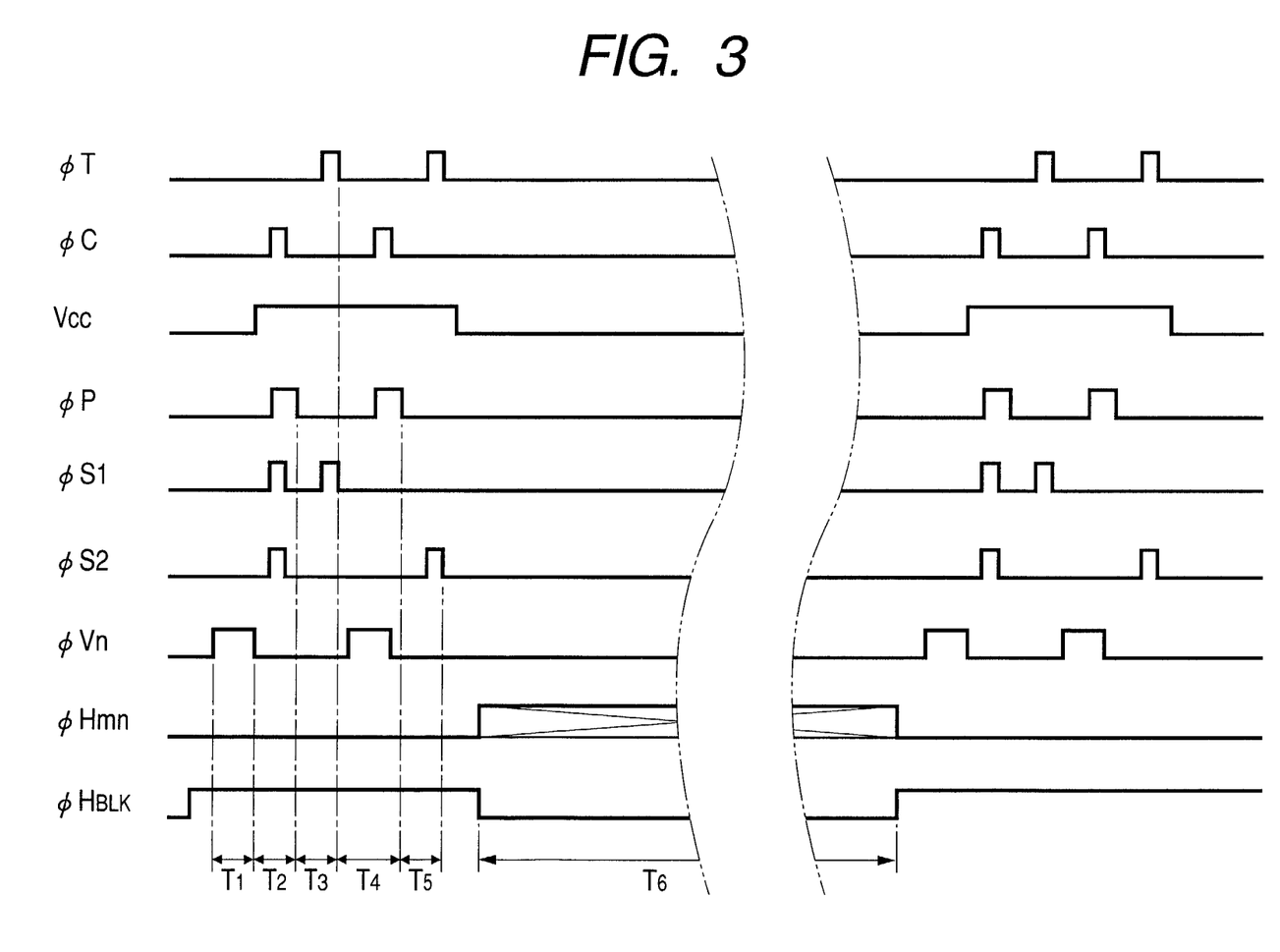
FIG. 3 is an operation timing chart of the charge detection circuit and signal processing circuit shown in FIG. 2.

FIG. 3 is an operation timing chart of the charge detection circuit and signal processing circuit shown in FIG. 2.

As shown in FIG. 3, first, the drive pulse φVn goes high during a period $T_1$ to transfer charges to the vertical CCD 2 on the input side of the transfer gate TG. During a period $T_2$, a power supply voltage Vcc of the charge detection amplifier (FD-Amp) is applied, a signal $\phi_C$ goes high to reset the gate of the charge detection amplifier (FD-Amp), a signal $\phi_P$ goes high to turn on the transistor Tp, the output terminal of the clamp capacitor Cp is clamped to the reference voltage, and signals $\phi_{S1}$ and $\phi_{S2}$ go high to reset the residual charges in the storage capacitors $C_{S1}$ and $C_{S2}$. At this time, reset noise and offset voltage components are clamped by the clamp capacitor Cp.

During a period $T_3$, a signal $\phi_T$ goes high to turn on the transfer gate TG and transfer the signal charges to the gate portion of the charge detection amplifier. The above-described reset noise and offset voltage are superposed on the output signal voltage from the charge detection amplifier. However, the noise is consequently removed at the output terminal of the clamp capacitor Cp, and the signal $\phi_{S1}$ goes high, so that the pixel signal of a row $V_1$, from which noise has been removed, is stored in the storage capacitor $C_{S1}$.

During periods $T_4$ and $T_5$, with the same operation as in the periods $T_2$ and $T_3$, charges in the vertical CCD 2 are transferred to the next cell. In a state wherein the power supply voltage Vcc of the charge detection amplifier (FD-Amp) is applied, the signal $\phi_C$ goes high to reset the gate of the charge detection amplifier (FD-Amp), and the signal $\phi_P$ goes high to clamp the output terminal of the clamp capacitor Cp to the reference voltage. The signals $\phi_T$ and $\phi_{S2}$ go high so that the pixel signal of a row $V_2$, from which noise has been removed, is stored in the storage capacitor $C_{S2}$.

After the end of the period $T_5$, the power supply voltage Vcc of the charge detection amplifier is turned off to prevent power consumption.

As described above, since the charge detection amplifier operates at a low speed in one horizontal scanning period, the frequency bandwidth is small. For this reason, noise generated in the amplifier is much smaller than in the output amplifier of a general CCD. In addition, because of low-frequency drive, no problem is posed in noise removing operation (CDS), i.e., clamp operation. To increase the 1/f noise reduction effect of the FD-Amp, the time required for reset operation of the FD-Amp and charge transfer from the vertical CCD is preferably short.

The signals stored in the storage capacitors $Cs_{S1}$ and $C_{S2}$ are sequentially output during a next period $T_6$ in accordance with a scanning pulse $\phi$Hmn ($\phi H_{01}$, $\phi H_{02}$, $\phi H_{03}$, ... ) from the horizontal scanning circuit 4. That is, since the signal is selected and output on the each pixel signal basis, the power consumption of the horizontal scanning circuit is low. In addition, since pixel signals of two rows can be simultaneously output, high-speed drive can be performed. If drive at a higher speed is necessary, the number of memories (storage capacitors) is increased to execute multiple-line output.

Figure 4:
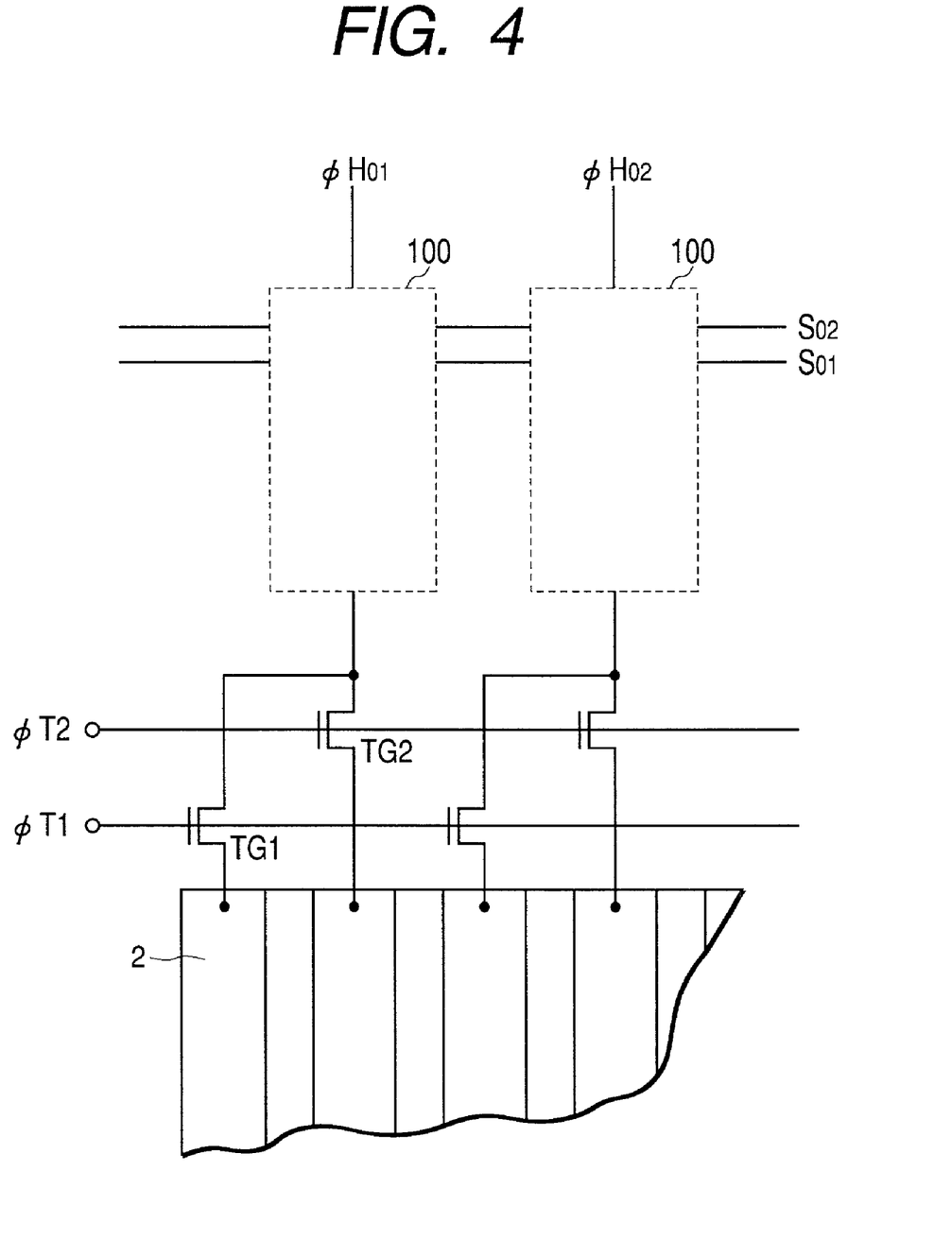
FIG. 4 is a view showing a solid-state image pickup element according to the second embodiment of the present invention.

FIG. 4 shows a solid-state image pickup element according to the second embodiment of the present invention. Circuits in a charge detection/signal processing block 100, which are identical to those in FIG. 2, are not illustrated in FIG. 4.

In this embodiment, charges in a plurality of vertical CCDs 2 are sequentially output using a common charge detection amplifier. Signals $\phi_{T1}$ and $\phi_{T2}$ are sequentially set to H level to turn on transfer gates $T_{G1}$ and $T_{G2}$ to sequentially control charge transfer from vertical CCDs of two columns to the charge detection amplifier whereby pixel signals of two columns are stored in storage capacitors $C_{S1}$ and $C_{S2}$ and output. In this embodiment, since the charge detection circuit and signal processing circuit can be formed in the width of two pixels, the chip area can be decreased.

The signal processing circuit can have a programmable gain amplifier, A/D conversion circuit, and for a color sensor, a white balance circuit, and the like.

Figure 5A:
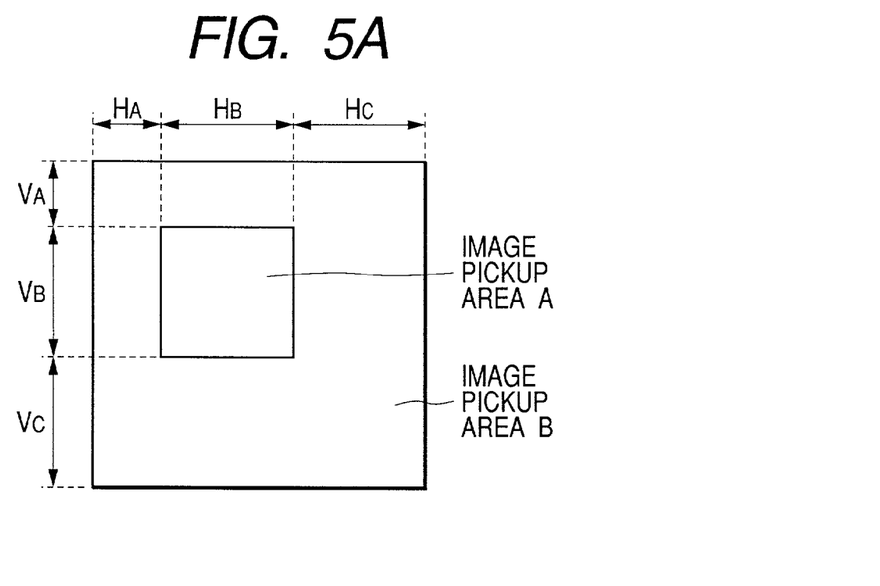
FIGS. 5A and 5B are explanatory views of random access drive according to the third embodiment of the present invention.
Figure 5B:
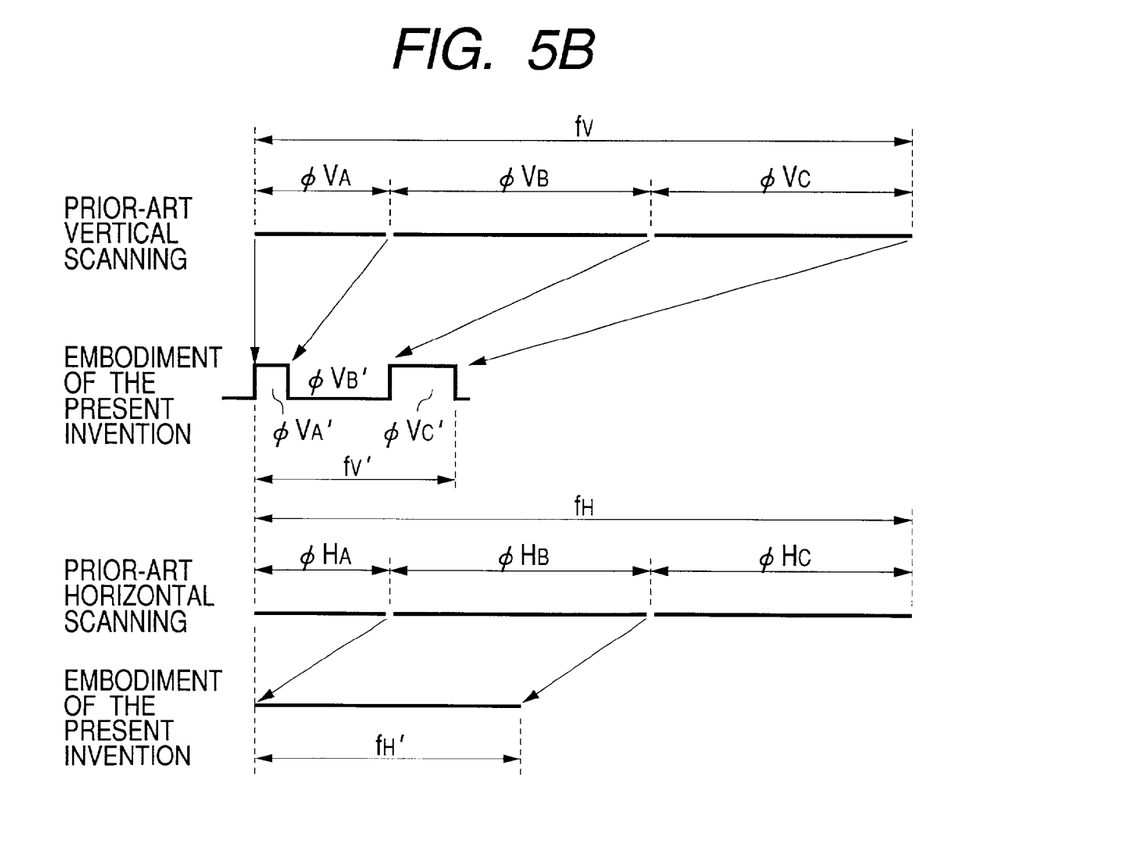

FIGS. 5A and 5B are explanatory views of the third embodiment related to random access drive. This embodiment has the same arrangement as described above except a horizontal scanning circuit 4, and as its characteristic feature, the solid-state image pickup element is a random-accessible solid-state image pickup element. FIG. 5A is a view showing an image pickup surface, and FIG. 5B is a timing chart of an image read from an image pickup area A.

An image pickup area includes the image pickup areas A and B. In the prior art, drive is performed using almost the same frequency for both the vertical and horizontal scanning periods. In fact, high-speed drive can be performed when only the image pickup area A that should be read out is read out. In the conventional CCD, it is difficult to read out the image pickup area A to be read out at a high speed. In the embodiment of the present invention, during an unnecessary image pickup period $V_A$ ($V_C$) in the vertical direction, the vertical CCD is driven at a high speed to remove unnecessary charges by a reset transistor TR of the charge detection amplifier. During an unnecessary image pickup period $H_A$ ($H_C$) in the horizontal direction, a random-accessible horizontal scanning circuit is arranged to execute scanning to output a signal only during a period $H_B$. That is, a decoder or a shift register which is divided into a plurality of areas and can start on each area basis is used. As a result, only the image signal in the image pickup area A can be read out. For this reason, high-speed drive can be achieved, and the power consumption can be reduced because the unnecessary image pickup area is not driven.

More developed random access can be realized by a CCD capable of selecting a pixel row. As a known example, an element is disclosed in the Institute of Image Information and Television Engineers technical report TEBS 101-6 ED 841. This known example is called a charge sweep device in which pixel row selection is driven by a vertical TG-SCANNER. When such a charge sweep device and the charge detection amplifier and signal processing circuit according to this embodiment are combined, the technological advantages of this embodiment can be expected.

Figure 6:
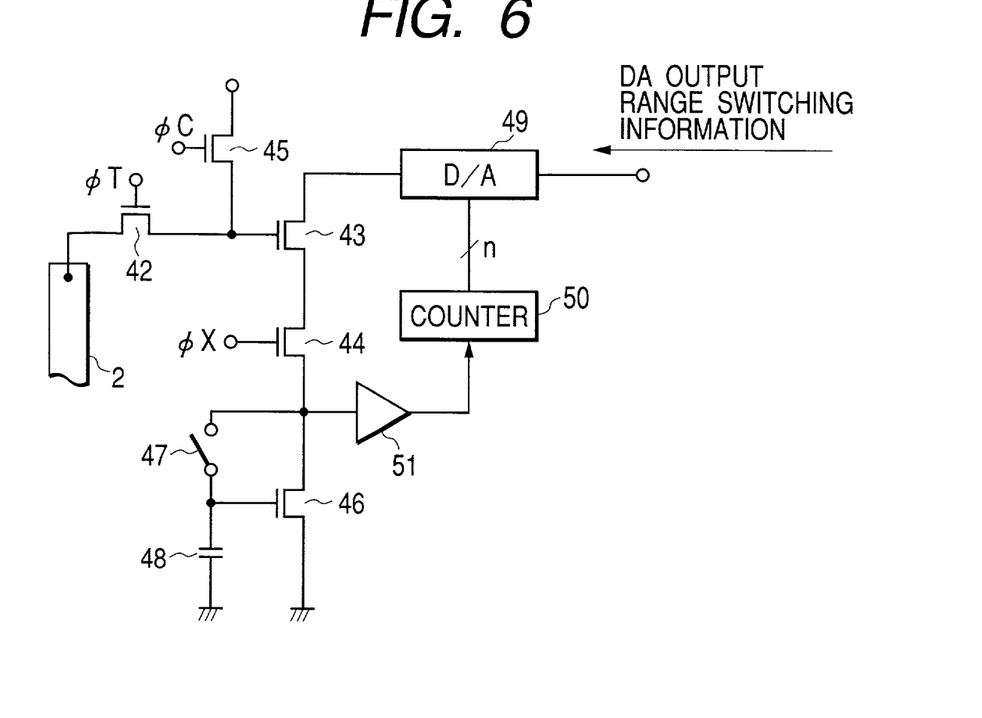
FIG. 6 is a block diagram of an equivalent circuit having a charge detection circuit and A/D conversion circuit unit according to the fourth embodiment of the present invention.

As a characteristic feature of the fourth embodiment, an A/D conversion circuit unit is prepared for each column. FIG. 6 is a block diagram of an equivalent circuit having a charge detection circuit and sequential-comparison-type A/D conversion circuit unit. A D/A converter receives DA output range switching information used to switch the range of the ramp-shaped reference voltage.

Referring to FIG. 6, the circuit comprises a vertical CCD 2, a transfer gate 42 for transferring signal charges from the vertical CCD 2 to the gate of an FD-Amp (floating diffusion amplifier) 43, a selection transistor 44, a reset transistor 45, a current supply transistor 46 for storing, as a voltage, the output current from the FD-Amp 43 by a switch 47 and storage capacitor 48 and outputting the voltage while converting it into a current, a comparator 51 for detecting the difference between the output current from the current supply transistor 46 and the output current from the FD-Amp 43 through the selection transistor 44, a counter 50 for counting the output from the comparator 51, and a D/A converter 49 for outputting a voltage to the source (main electrode) terminal of the FD-Amp 43 in accordance with a digital signal output from the counter 50. The D/A converter 49 receives DA output range switching information to switch the range of the ramp-shaped reference voltage to be output from the D/A converter 49 such that the pixel signal has an optimum value within the A/D input voltage range.

Figure 7:
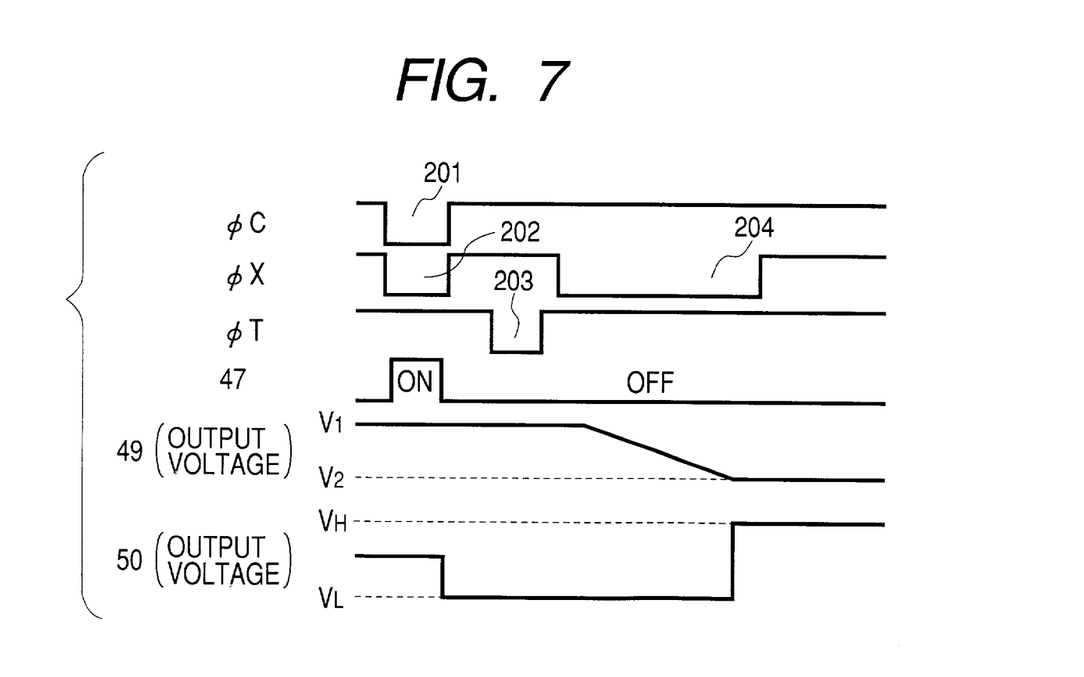
FIG. 7 is a timing chart for explaining the operation shown in FIG. 6.

A method of obtaining a signal voltage by signal charges from the vertical CCD after the FD-Amp is reset in the above arrangement will be described as an example with reference to the timing chart shown in FIG. 7. The description below will be made while assuming that the transistors 42, 43, 44, and 45 shown in FIG. 6 are PMOS transistors, and the transistor 46 is an NMOS transistor. The D/A converter 49 is set to output a high potential ($V_{HD}$). Assume that the counter 50 is reset and no count operation is being performed. A signal $\phi_C$ is set to "L" level (pulse 201) to turn on the reset transistor 45 to reset the gate terminal of the FD-Amp 43 to a predetermined potential. Simultaneously, a signal $\phi_X$ is set to "L" level (pulse 202) to turn on the selection transistor 44 and also turn on the switch 47. The output current from the FD-Amp 43 at the time of reset is stored in the storage capacitor 48 as a gate voltage generated when the gate and drain of the transistor 46 short-circuit (the comparison reference voltage is stored). After that, the transistors 45 and 44 and switch 47 are turned off, and a signal $\phi_T$ is set to "L" level (pulse 203) to turn on the transfer gate 42 to transfer signal charges from the vertical CCD to the gate terminal of the FD-Amp 43. If the gate potential at this time is lower than that at the time of reset, the output current from the FD-Amp 43 has a larger value than at the time of reset. The transistor 46 receives the voltage from the storage capacitor 48 and outputs the current when the FD-Amp 43 is reset. When the signal $\phi_X$ is set to "L" level (pulse 204) to turn on the transistor 44 again, the input potential of the comparator 51 rises to a high potential ($V_H$). After that, the counter 50 is operated, and its digital output is amplified. The output voltage from the D/A converter 49 that receives the output from the counter 50 gradually decreases (assume that the D/A converter 49 generates a negative analog output voltage with respect to the digital input signal). At certain time, the output current from the FD-Amp 43 becomes equal to that from the transistor 46, and the input voltage to the comparator 51 abruptly decreases. Upon detecting that change, the count operation of the counter 50 is stopped.

The digital value that has changed during a period from the start to the end of counting by the counter 50 equals to the difference between the gate potential of the FD-Amp 43 at the time of reset and the potential when the signal charges are transferred. In this way, A/D conversion is executed correspondingly to the difference.

Figure 8:
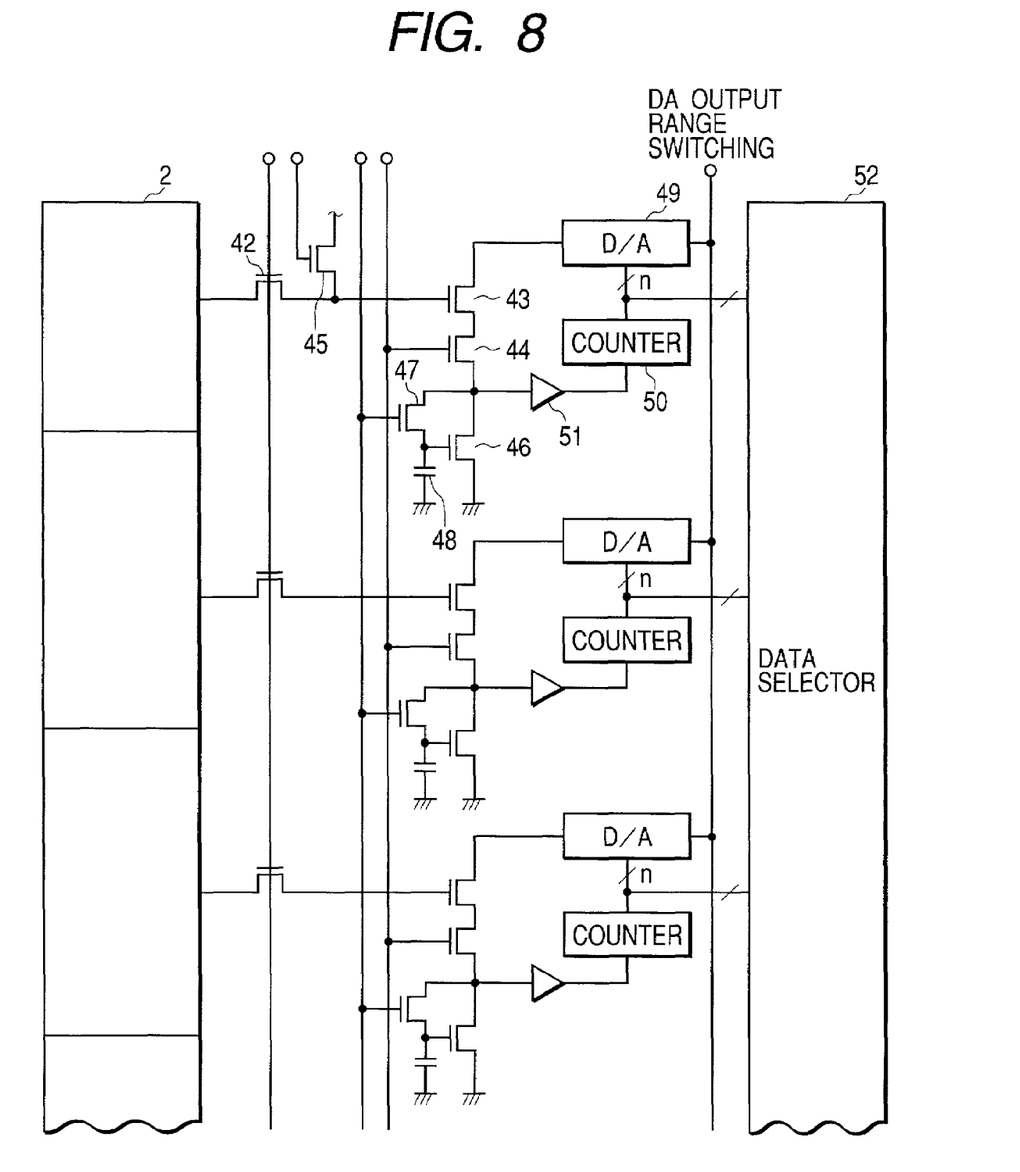
FIG. 8 is a schematic circuit diagram showing connection between a vertical CCD and a charge detection circuit and A/D conversion circuit according to the fourth embodiment of the present invention.

FIG. 8 is a schematic circuit diagram showing connection between the vertical CCD and the charge detection circuit and A/D conversion circuit. The same reference numerals as in FIG. 6 denote the same members in FIG. 8.

The signal charges from the vertical CCD 2 are input to the gate of the FD-Amp 43, converted into digital data by the counter 50, sequentially selected by a data selector 52, and output as A/D-converted data.

Figure 9A:
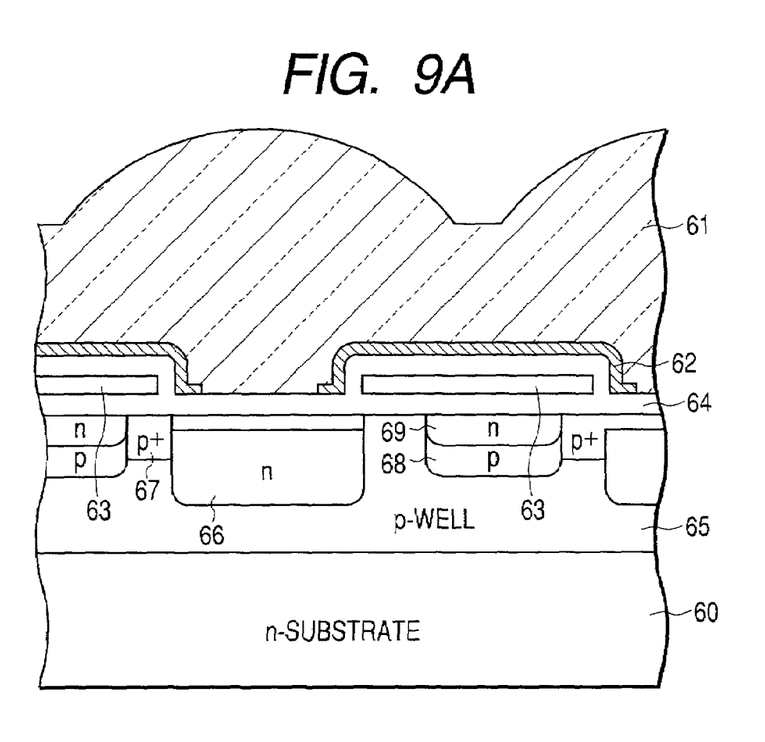
FIGS. 9A and 9B are sectional views showing the structure of a solid-state image pickup element according to the fifth embodiment of the present invention.
Figure 9B:
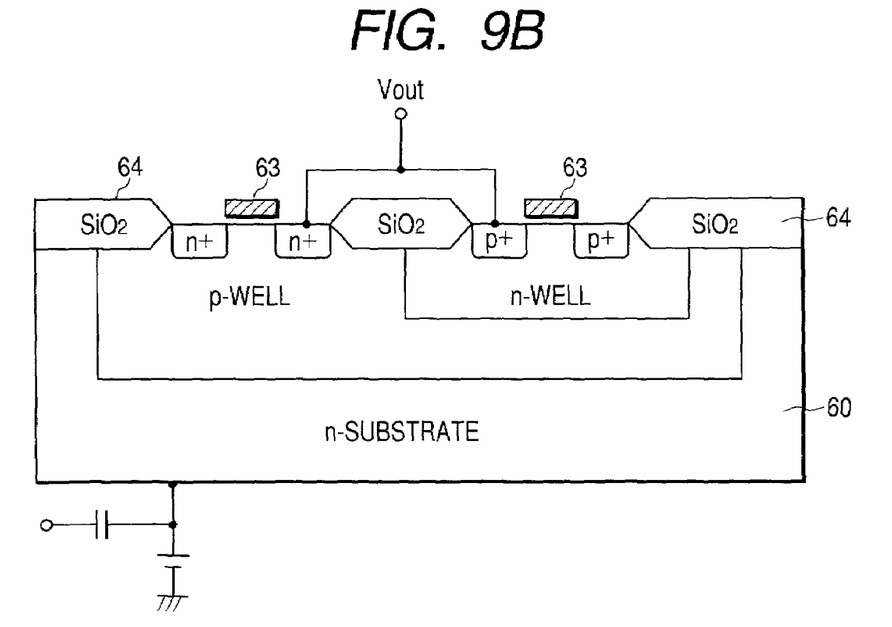

FIGS. 9A and 9B are sectional views showing the structure of a solid-state image pickup element according to the fifth embodiment. FIG. 9A is a sectional view showing the structure of a photoelectric conversion unit, vertical CCD, and channel stop. FIG. 9B is a sectional view showing the structure of an inverter unit that forms part of a signal processing circuit.

As shown in FIG. 9A, a unit pixel is formed from a PD region serving as a photoelectric conversion unit, a transfer gate region for transferring charges, a vertical CCD region, and a channel stop region. These regions are formed in a p-well 65 formed on an n-substrate 60. In the PD region, a dark current is reduced by a $p^+$-layer 67 on the surface. In the vertical CCD region, a p-layer 68 is formed under an n-layer 69 to reduce an increase and smearing in transfer charge amount. In the transfer gate region, control is executed to transfer photocharges, which are accumulated in an area 66, from the PD to the vertical CCD. The solid-state image pickup element also has a microlens 61 for focusing light in the PD region, a light-shielding layer 62, a gate electrode 63 made of polysilicon, and an $SiO^2$ layer 64.

As shown in FIG. 9B, in the inverter unit as part of the signal processing circuit, a p-well and n-well are formed on the n-substrate 60 to form an NMOS transistor and PMOS transistor.

Figure 13:
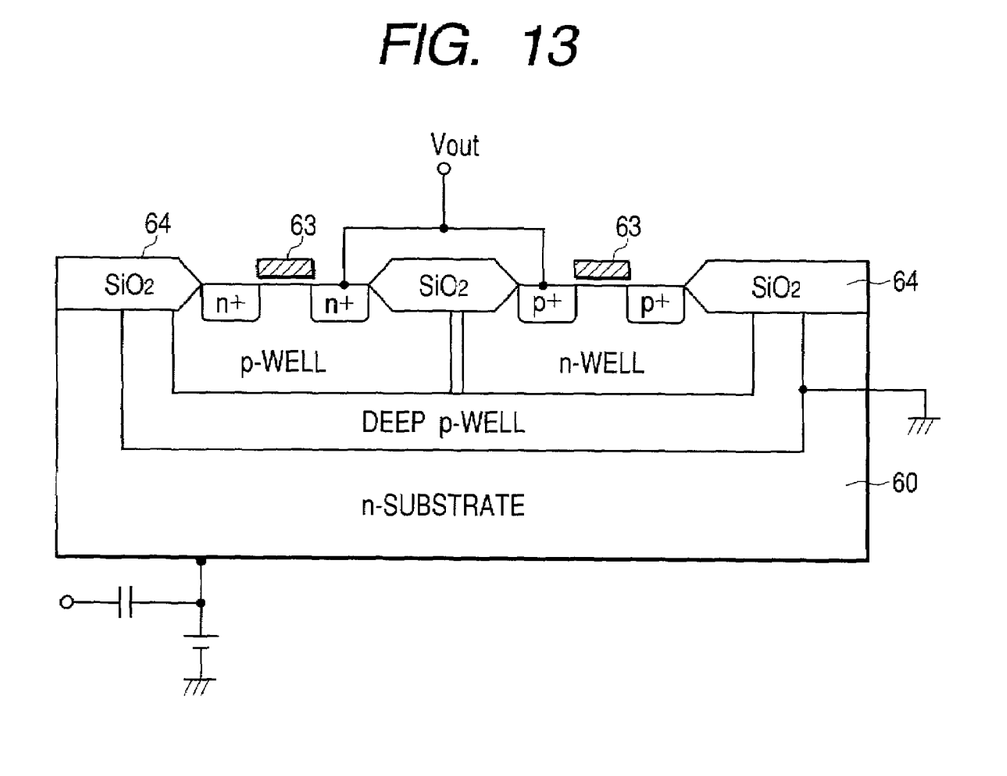
FIG. 13 is a view showing a structure in which an inverter unit is separated by a deep well.

Well separation between the CCD unit and the signal processing circuit unit is preferably done from the charge detection circuit unit. This is because the signal processing circuit unit generates pulse noise due to high-speed signal transfer or the logic circuit. To prevent noise from propagating from the noise source to the CCD unit, the CCD unit and signal processing circuit are separated by the well. For some application purposes, the charge detection circuit unit may be formed in the CCD well. Since the charge detection circuit unit has a function of converting signal charges into a voltage every horizontal period and therefore operates at a low speed, it generates little noise. FIG. 13 shows a structure in which the inverter unit is separated by a deep well. When the inverter unit is completely separated from the sensor unit, noise from the inverter unit can be more effectively shielded. The solid-state image pickup element of this embodiment can have any one of the equivalent circuits of the first to fourth embodiments.

The sixth embodiment wherein the solid-state image pickup element of any one of the above-described first to fourth embodiments is applied to a digital still camera (image pickup apparatus) will be described in detail with reference to FIG. 10.

Figure 10:
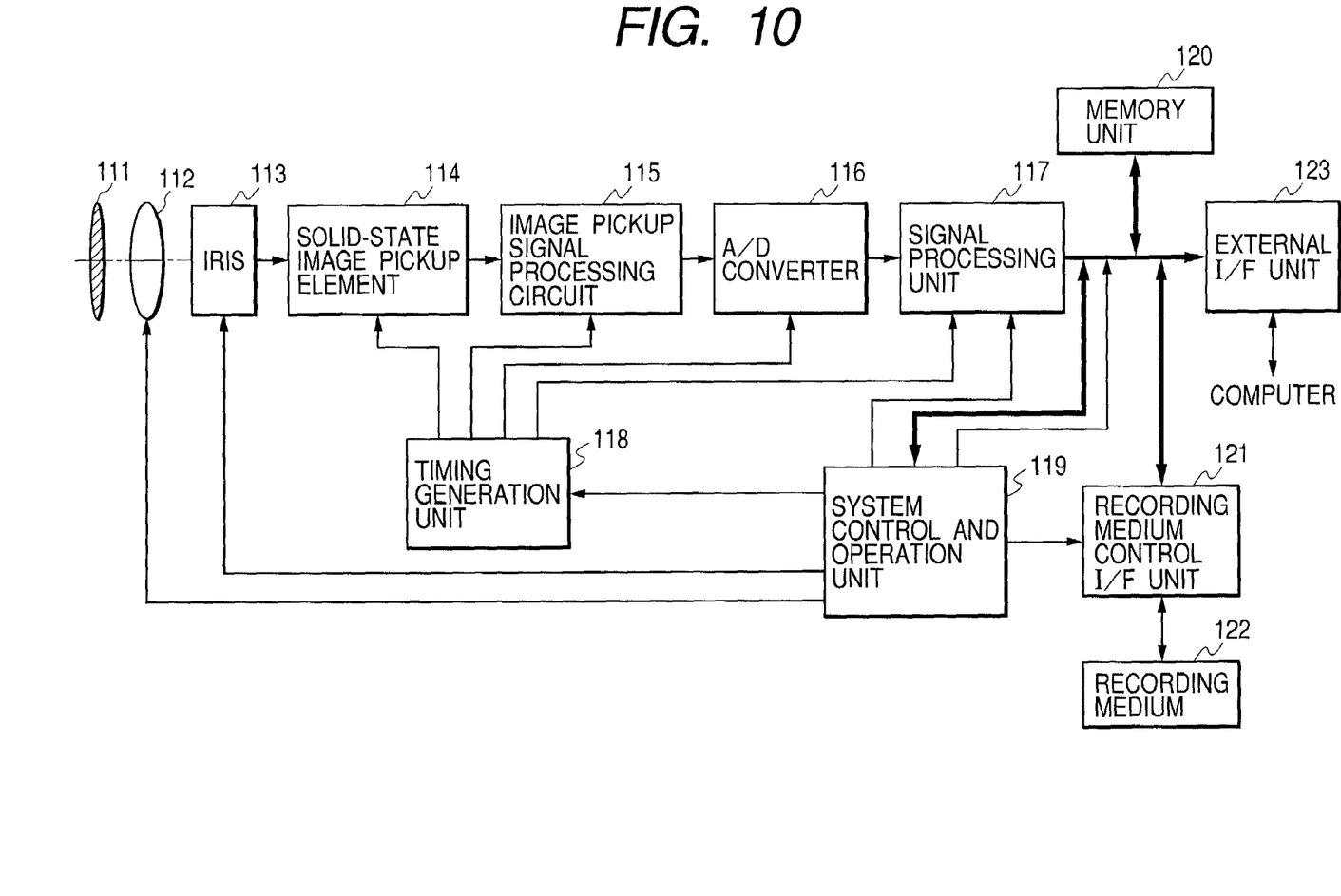
FIG. 10 is a block diagram showing a case wherein the solid-state image pickup element of any one of the first to fifth embodiments is applied to a "digital still camera"

Referring to FIG. 10, the camera has a barrier 111 serving as the protection and main switch of a lens, a lens 112 for forming an optical image of an object onto a solid-state image pickup element 114, an iris 113 for changing the amount of light transmitted through the lens 112, the solid-state image pickup element 114 for receiving the object image formed by the lens 112 to output an image signal, an image pickup signal processing circuit 115, an A/D converter 116 for executing A/D conversion of the image signal output from the image pickup signal processing circuit 115, a signal processing unit 117 for executing various kinds of correction operations for the image data output from the A/D converter 116 or compressing the data, a timing generation unit 118 for outputting various kinds of timing signals to the solid-state image pickup element 114, image pickup signal processing circuit 115, A/D converter 116, and signal processing unit 117, a system control and operation unit 119 for executing various kinds of operations and controlling the entire still video camera, a memory unit 120 for temporarily storing the image data, an interface unit 121 for recording/reading out the image data on/from a recording medium, a detachable recording medium 122 such as a semiconductor memory for recording or reading out image data, and an interface unit 123 for communication with an external computer or the like.

The operation of the still video camera with the above-described arrangement in the phototaking mode will be described next. When the barrier 111 is opened, the main power supply is turned on, the power supply of the control system is turned on next, and finally, the power supply of the image pickup system circuit such as the A/D converter 116 is turned on. To control the exposure amount, the system control and operation unit 119 sets the iris 113 in the full-aperture state. The signal output from the solid-state image pickup element 114 is converted by the A/D converter 116 and input to the signal processing unit 117. The system control and operation unit 119 executes calculation for exposure on the basis of the data. The brightness is determined on the basis of the result of photometry, and in accordance with the result, the system control and operation unit 119 controls the iris.

On the basis of the signal output from the solid-state image pickup element 114, a high-frequency component is extracted, and the distance to the object is calculated by the system control and operation unit 119. After that, the lens is driven, and it is determined whether an in-focus state is obtained. If it is determined that no in-focus state is obtained, the lens is driven again, and distance measurement is performed. After confirming the in-focus state, actual exposure starts.

When exposure is ended, the image signal output from the solid-state image pickup element 114 is A/D-converted by the A/D converter 116, passes through the signal processing unit 117, and is written in the memory unit by the system control and operation unit 119.

After that, the data stored in the memory unit 120 is recorded on the detachable recording medium 122 such as a semiconductor memory through the recording medium control I/F unit 121 under the control of the system control and operation unit 119. The image data may be directly input to a computer or the like through the external I/F unit 123 to process the image.

As has been described above in detail, according to this embodiment, a sensitive image pickup apparatus capable of high-performance function, high-speed drive, and power consumption reduction can be provided.

Many widely different embodiments of the present invention may be constructed without departing from the spirit and scope of the present invention. It should be understood that the present invention is not limited to the specific embodiments described in the specification, except as defined in the appended claims.

What is claimed is:

1. An image pickup apparatus comprising:
    a solid-state image pickup element formed on a single semiconductor chip, said solid-state image pickup element including:
    photoelectric conversion units arranged two-dimensionally;
    a plurality of CCDs adapted to transfer charges generated by said photoelectric conversion units, each of said plurality of CCDs being arranged correspondingly to each line of photoelectric conversion units;
    a plurality of charge detection circuits adapted to detect the charges from said CCDs and supplying corresponding signal levels, each of said plurality of charge detection circuits being arranged correspondingly to each CCD;
    a plurality of A/D conversion circuits adapted to generate digital signals from the differences between the signal levels supplied by said charge detection circuits and noise levels of said photoelectric conversion units, respectively, each of said A/D conversion circuits being arranged correspondingly to each charge detection circuit; and
    a plurality of circuit elements, each providing a ramp-shaped reference voltage to a respective one of the plurality of charge detection circuits in response to receiving a digital signal from a respective one of said plurality of A/D conversion circuits.

2. An apparatus according to claim 1, wherein said A/D conversion circuit comprises a sequential-comparison-type circuit.

3. An apparatus according to claim 2, wherein said CCD and said charge detection circuit are separated by a well.

4. An apparatus according to claim 1, further comprising a lens adapted to form a light image on said solid-state image pickup element, and
    a signal processing circuit adapted to process a signal from said solid-state image pickup element.

5. An apparatus according to claim 1, wherein each of said plurality of A/D conversion circuits comprises a counter.

6. An apparatus according to claim 1, wherein each of said plurality of circuit elements is adapted to receive output range switching information.

7. An apparatus according to claim 1, wherein each of said plurality of circuit elements comprises a D/A converter.

8. An apparatus according to claim 7, wherein each of said plurality of charge detection circuits comprises a floating diffusion amplifier, the source of which receives an output of its respective D/A converter and the gate of which receives charges from its respective CCD.

* * * * *